United States Patent [19]

Beppu et al.

[11] 3,935,039

[45] Jan. 27, 1976

[54] METHOD OF MANUFACTURING A GREEN LIGHT-EMITTING GALLIUM PHOSPHIDE DEVICE

[75] Inventors: Tatsuro Beppu, Tokyo; Masami Iwamoto, Yokohama; Tetsuo Sekiwa, Kawasaki, all of Japan

[73] Assignee: Tokyo Shibaura Electric Co., Ltd., Kawasaki, Japan

[22] Filed: Apr. 3, 1974

[21] Appl. No.: 457,649

[30] Foreign Application Priority Data

Apr. 4, 1973 Japan................................ 48-38483

[52] U.S. Cl. ................ 148/171; 148/172; 148/173; 252/62.3 GA
[51] Int. Cl.² .......................................... H01L 7/38
[58] Field of Search ........................ 148/171–173; 252/62.3 GA

[56] References Cited
UNITED STATES PATENTS

| | | | |
|---|---|---|---|
| 3,462,320 | 8/1969 | Lynch et al. ...................... | 148/171 |
| 3,603,833 | 9/1971 | Logan et al. ...................... | 148/171 X |
| 3,617,820 | 11/1971 | Herzog ........................ | 148/189 UX |
| 3,646,406 | 2/1972 | Logan et al. ...................... | 148/171 X |
| 3,725,749 | 4/1973 | Groves et al. ..................... | 148/171 X |
| 3,755,017 | 8/1973 | Coughlin ............................ | 148/189 |

OTHER PUBLICATIONS

Stringfellow, J. Electrochem. Soc.: Solid–State Science and Technology, Vol. 19, No. 12, Dec. 1972, pp. 1780–1782.

Primary Examiner—G. Ozaki
Attorney, Agent, or Firm—Cushman, Darby & Cushman

[57] ABSTRACT

A method of manufacturing a green light-emitting gallium phosphide device which comprises the steps of preparing a liquid-phase epitaxial solution of one conductivity type containing a high concentration of nitrogen at a higher temperature than 1000°C; bringing said epitaxial growth solution now cooled to 600°C to 1000°C into contact with a gallium phosphide substrate of the same conductivity type as said solution; cooling said epitaxial growth solution to form a liquid-phase epitaxial layer on said substrate; and forming a region in close proximity to said liquid-phase epitaxial layer with the opposite conductivity type thereto.

7 Claims, 2 Drawing Figures

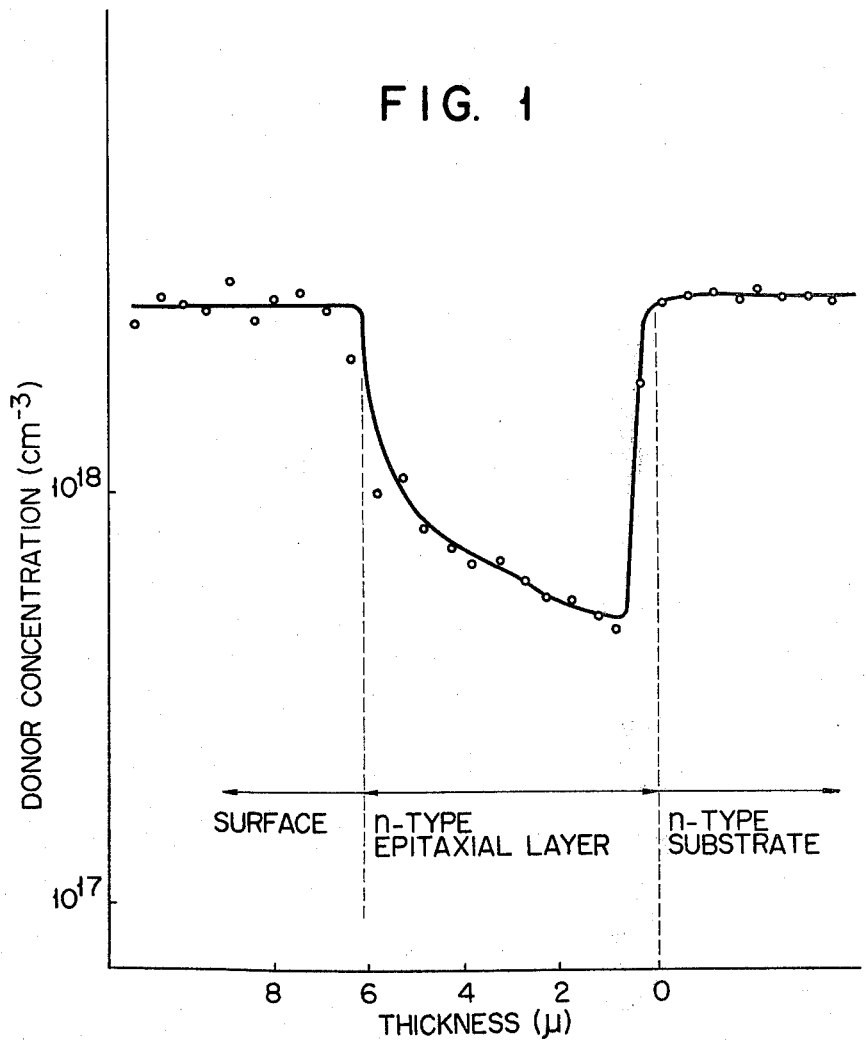

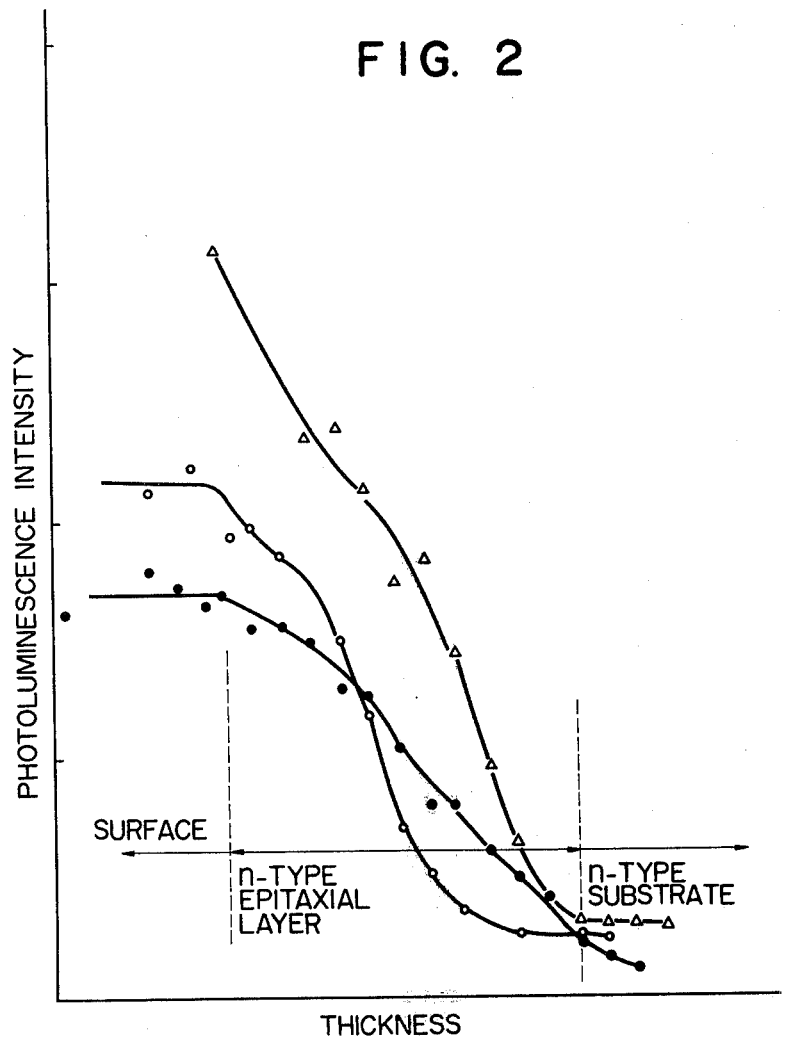

METHOD OF MANUFACTURING A GREEN LIGHT-EMITTING GALLIUM PHOSPHIDE DEVICE

This invention relates to a method of manufacturing a green light-emitting gallium phosphide device.

The common practice of forming a p-n junction for the object of attaining a very efficient light emission using gallium phosphide (hereinafter abbreviated as "GaP") is to carry out the process of double liquid--phase epitaxy, which consists in forming a liquid phase epitaxial layer on a single crystal substrate prepared by the liquid-encapsulated Czochralski process with the same conductivity type as said substrate, and further superposing another liquid-phase epitaxial layer on the first mentioned layer with the opposite conductivity type so as to form a p-n junction.

This double liquid-phase epitaxy can reduce the lattice defects of a region in the proximity of the p-n junction even if a substrate crystal happens to have a relatively large number of lattice defects and also control the concentration of impurities defining the conductivity type of said liquid-phase epitaxial layers and that of nitrogen atoms constituting the luminescent center.

Where a p-n junction is formed by growing double epitaxial layers on an n-type single crystal substrate prepared by the liquid-encapsulated Czochralski process, then a donor impurity contained in a first n-type layer generally has such a pattern of distribution as illustrated in FIG. 1. This distribution is generally defined, for example, by the segregation coefficient of the donor impurity in liquid phase and solid phase, the diffusion coefficient thereof in the epitaxial growth solution and the growing velocity of a single crystal. As apparent from FIG. 1, the pattern of said distribution has a sharply rising portion in the direction of epitaxial growth, said rise becoming prominent particularly near the surface of the first n-type epitaxial layer. Where, therefore, the surface of this first n-type epitaxial layer is used in an intact state in providing a p-n junction by the growth of a second epitaxial layer, then the donor impurity present in the n-type region of said p-n junction will indicate a widely varying concentration, resulting in the considerably changing properties of a product. To eliminate such drawbacks, therefore, the common practice is to grind the surface of the first n-type epitaxial layer to expose the interior portion thereof wherein the donor impurity has a gentle gradient of concentration, and form a second epitaxial layer on said ground surface.

On the other hand, nothing is known of the distribution in an epitaxial layer of nitrogen atoms acting as the green-emitting center of the GaP by substituting some of the phosphorous atoms of said GaP. To date, the nitrogen atoms have been supposed to have a substantially uniform distribution. However, the present inventors have disclosed for the first time the distribution of the nitrogen atoms in an epitaxial layer from the measured distribution of the intensity of photoluminescence (hereinafter appreviated as "PL"). There will now be briefly described the present inventors' experiments leading to this discovery. A laminate consisting of an n-type substrate and an n-type epitaxial layer grown thereon was grounded on one side to have a prescribed angle. Th ground surface was excited by a laser of argon ion having a wave length of 4,880A. A green light emitted by the impurity of nitrogen atoms was received by a photoelectron amplifier to determine the distribution of the PL intensity in an epitaxial layer. Actually, however, this distribution of the PL intensity does not represent the distribution of only nitrogen atoms included in the epitaxial layer, but is subject to the effect of non-radiative recombination center. A combination of these elements constitutes an important factor in determining the light-emitting property of the p-n junction of the GaP. FIG. 2 shows the measured distribution of the PL intensity of three lots of the above-mentioned laminate which consisted of an n-type single crystal GaP substrate and an n-type epitaxial layer grown on said substrate by cooling it from 1000°C at the rate of 5.4°C per minute and was ground to provide an angle of 1°27' on one side. As seen from FIG. 2, the PL intensity has a distribution closely resembling that of the donor impurity shown in FIG. 1. The PL intensity increases in the direction of epitaxial growth, though a carrier should naturally be expected to have a longer life in the interior of an epitaxial layer grown on the substrate than on the surface of said layer in view of the fact that the concentration of the donor impurity is increasingly distributed in the direction of epitaxial growth. It can be inferred from the above-mentioned fact that the nitrogen atoms themselves are also more concentrated in the direction of epitaxial growth.

Accordingly, the grinding of the surface of the first n-type epitaxial layer, as practised in the prior art, to expose the interior thereof means that only that region of GaP is used where nitrogen atoms acting as luminescent center are sparsely concentrated, thus failing to meet the demand for a high efficiency of luminescence.

It is accordingly the object of this invention to provide a green light-emitting GaP device having a high degree of external quantum efficiency with very little variation.

The method of manufacturing a gree light-emitting GaP device according to this invention characteristically comprises the steps of preparing a liquid-phase epitaxial solution of one conductivity type containing a high concentration of nitrogen atoms at a higher temperature than 1000°C; bringing said solution now cooled to 600°C to 1000°C into contact with a single crystal GaP substrate having the same type of conductivity as said solution; cooling said solution at a prescribed rate for the growth of a liquid-phase epitaxial layer containing nitrogen on said substrate; and forming a region in close proximity to said epitaxial layer with the opposite conductivity type thereto.

The above-mentioned high content of nitrogen in the epitaxial growth solution means a saturated or a slightly smaller amount of nitrogen. The nitrogen contained in said solution is supplied from nitrogen compounds such as ammonia, GaN, PN, $P_2N_3$ and $P_3N_5$. It is preferred that nitrogen be added to the epitaxial growth solution maintained at a temperature of 1030° to 1100°C. It is also desired that said solution be brought into contact with the substrate after being cooled to a level ranging between 900° and 1000°C. A region in close proximity to the first epitaxial layer already formed on the substrate may be formed by the process of liquid phase-epitaxy or diffusion with the opposite conductivity type to said first epitaxial layer.

The present inventors' experiments show that the above-mentioned region formed by the liquid-phase epitaxial process enabled the resultant GaP device to display a higher degree of luminescence than that by the diffusion process. The reason is assumed to be that the region prepared by the liquid phase-epitaxial process has fewed lattice defects than that by the diffusion process. Even in the case of the diffusion process, however, the GaP device may be made to indicate a high degree of luminescence by properly selecting the conditions of diffusion.

This invention can be more fully understood from the following detailed description when taken in conjunction with the accompanying drawings, in which:

FIG. 1 shows the doping profile of an n-type liquid-phase epitaxial layer grown on a substrate; and FIG. 2 is a curve diagram showing the distribution of photoluminescence of several lots of said n-type liquid-phase epitaxial layer in the direction of epitaxial growth.

There will now be described the embodiment of this invention where an n-type epitaxial GaP layer is formed on an n-type GaP substrate, and later a p-type region is formed adjacent to said first n-type GaP layer. Nitrogen atoms incorporated in the first n-type liquid-phase epitaxial layer so as to act as luminescent center are generally increasingly concentrated, as apparent from the distribution of PL intensity thereof, toward the region where said n-type liquid phase epitaxial layer is precipitated at a relatively low temperature or the surface of said epitaxial layer. Therefore, it is advised to maintain the donor concentration (Nd) in the n-type epitaxial layer near the p-n junction at a lower level than the acceptor concentration (Na) in the p-type epitaxial layer and incorporate nitrogen atoms acting as luminescent centers in the n-type epitaxial layer instead of in the p-type one. This process causes the p-n junction to be formed in the n-type epitaxial layer, and also nitrogen atoms to be highly concentrated in a region of diffused current spaced less than several microns from both sides of the p-n junction (a luminescent region), reducing an amount of such donor impurities as are likely to act as non-radiative recombination center. Further, the concentration distribution of nitrogen atoms acting as green-emitting center in the n-type epitaxial layer has a gradient sharply rising in the direction of epitaxial growth, thus preventing light emitted by said center from being absorbed in the outside of luminescent region, and consequently elevating the external quantum efficiency of an indirect band gap semiconductor such as GaP.

Where nitrogen atoms acting as luminescent centers are concentrated with a sharply rising distribution pattern as shown in FIG. 2, a p-n junction should, of course, be formed in the surface of n-type epitaxial layer due to the presence of said nitrogen atoms. In this case, however, the uneven thickness of said n-type epitaxial layer gives rise to a prominent variation in the concentration of nitrogen atoms acting as luminescent centers, causing a plurality of luminescent elements cut out from a single wafer also to present a widely different light-emitting property. Where, therefore, the distribution pattern of nitrogen atoms has a sharp gradient as described above, the n-type epitaxial layer containing said nitrogen atoms should have a uniform thickness.

From the above-mentioned point of view, determination was made of the distribution of PL intensity by varying the temperature at which the first n-type epitaxial layer began to be grown. Throughout the experiments, gallium was used in an amount of 20g, to which GaP was added in an amount saturable at the respective temperatures of epitaxial solution.

Incorporation of nitrogen atoms was carried out by passing hydrogen gas containing 0.1% of ammonia gas at the rate of 4 ml/min·cm². The epitaxial growth solution was cooled at the rate of 5°C/min. The results of these experiments are set forth in Table 1 below.

Table 1

| Initial temperature of epitaxial growth $T$ max (°C) | Thickness of epitaxial layer $\Delta d$ ($\mu$) | Distribution of PL intensity | | PL max (optional scale) |
|---|---|---|---|---|
| | | $\log \frac{PL \text{ max}}{PL \text{ center}}$ | $\frac{\log \frac{PL \text{ max}}{PL \text{ center}}}{\Delta d}$ | |
| 900 | 15 | 0.8 | $5.3 \times 10^{-2}$ | 50 |
| 1000 | 25 | 0.5 | $2.0 \times 10^{-2}$ | 60 |
| 1050 | 50 | 0.1 | $2.0 \times 10^{-3}$ | 80 |
| 1100 | 80 | 0.08 | $1.0 \times 10^{-3}$ | 80 |

Referring to Table 1 above, the term "PL center" denotes a PL intensity of the central line of an epitaxial layer as viewed from the doping profile and the term "PL max" represents a PL intensity on the surface of said epitaxial layer. A gradient of the distribution of PL intensity may be expressed by the following compound fraction as a guide:

$$\frac{\log \frac{PL \text{ max}}{PL \text{ center}}}{\Delta d}$$

Table 1 above shows that the distribution pattern of PL intensity presents a sharper gradient as epitaxial growth is commenced at a lower temperature. It is desired, therefore, to initiate epitaxial growth at a lower temperature than 1000°C. Table 1 also indicates that the PL max decreases as epitaxial growth starts at a lower temperature. This event is assumed to originate with the fact that the fall of the T max leads to a smaller amount of gallium nitride produced from gallium and ammonia. It is, therefore, expected that where it is desired to render the distribution pattern of PL intensity sharper and also to elevate the PL max, it is advised to maintain the temperature of an epitaxial growth solution once at a higher level than 1000°C, add nitrogen to said solution under this condition and later carry out liquid-phase epitaxial growth by reducing the temperature of said solution to a lower level than 1000°C. The results of experiments conducted in this respect are presented in Table 2 below.

Table 2

| | Temperature for addition of nitrogen (°C) | Initial temperature of epitaxial growth $T$ max (°C) | Gradient of distribution of PL intensity $\frac{\log \frac{PL \text{ max}}{PL \text{ center}}}{\Delta d}$ | PL max (optional scale) |
|---|---|---|---|---|
| A | 900 | 900 | 0.053 | 50 |
| B | 1100 | 900 | 0.052 | 70 |

Referring to Table 2 above, the character A represents the case where the temperature of an epitaxial growth solution was fixed at 900°C from the start. The character B denotes the case where said solution was once maintained at 1100°C, nitrogen was added under this condition to said solution from ammonia contained in a carrier gas and later liquid-phase epitaxial growth was effected by reducing the temperature of said solution to 900°C. Except for the temperature, the experiments of Table 2 were carried out under the same conditions as those of Table 1 with respect to both cases A and B.

Table 2 shows that in the case of B, there was obtained an n-type epitaxial layer wherein, as anticipated in the foregoing description, the distribution pattern of PL intensity presented a sharp gradient and the PL max was elevated.

Formation of a first n-type epitaxial layer for preparation of a GaP device of high luminescence should advisably be effected under the following conditions conducted from the above-mentioned experimental results:

1. A liquid epitaxial growth solution is maintained at a higher temperature than 1000°C. Nitrogen at high concentration is added under this condition to said solution from ammonia contained in a carrier gas.

2. Later, the epitaxial growth solution is maintained at a prescribed temperature lower than 1000°C. Epitaxial growth is carried out at said temperature.

Where the above-mentioned conditions are fully met, it is possible to provide an n-type epitaxial layer wherein nitrogen atoms acting as green-emitting center are highly concentrated on the surface and the distribution pattern of the nitrogen atoms has a gradient sharply rising in the direction of epitaxial growth, namely, an n-type epitaxial layer wherein the nitrogen atoms are more concentrated on the luminescent region than in the interior of said layer where the nitrogen atoms themselves scattered therein conversely tend to absorb the light emitted by the nitrogen atoms concentrated on the surface of the n-type epitaxial layer. Further, the n-type epitaxial layer grown at a lower temperature than 1000°C can have the variation of its thickness extremely reduced. For example, where the epitaxial growth of the n-type epitaxial layer is commenced at 1100°C, then said layer will have a thickness of about $\Delta d = 80\mu \pm 15 \mu$. In contrast, where the epitaxial growth starts at 900°C, then said layer will have a thickness of about $\Delta d = 15\mu \pm 2\mu$. If, therefore, the previously mentioned conditions of epitaxial growth are fully met, then variations in the PL intensity on the surface of respective GaP pieces cut out from a wafer consisting of the n-type epitaxial layer and n-type substrate will be considerably reduced to about ±5%. Where, therefore, a p-type epitaxial layer is grown on said wafer to produce a diode wafer, then it will be substantially unnecessary to treat the surface of the first n-type epitaxial layer on which said p-type epitaxial layer is superposed.

Determination was made of the photoluminescent property of a large number of GaP diodes, the results being set forth in Table 3 below.

Table 3

| Lot | Diode No. | External quantum efficiency (%) Group a | Group b |
|---|---|---|---|
| I | 1 | 0.092 | 0.045 |
|  | 2 | 0.094 | 0.051 |
|  | 3 | 0.092 | 0.053 |
|  | 4 | 0.093 | 0.049 |
|  | 5 | 0.093 | 0.052 |
|  | 6 | 0.091 | 0.052 |
|  | 7 | 0.093 | 0.048 |
|  | 8 | 0.092 | 0.050 |
|  | 9 | 0.092 | 0.051 |
|  | 10 | 0.093 | 0.052 |
| II | 1 | 0.035 | 0.024 |
|  | 2 | 0.044 | 0.022 |

Table 3-continued

| Lot | Diode No. | External quantum efficiency (%) Group a | Group b |
|---|---|---|---|
| II | 3 | 0.041 | 0.023 |
|  | 4 | 0.039 | 0.025 |
|  | 5 | 0.048 | 0.020 |
|  | 6 | 0.033 | 0.023 |
|  | 7 | 0.029 | 0.018 |
|  | 8 | 0.037 | 0.022 |
|  | 9 | 0.048 | 0.021 |
|  | 10 | 0.046 | 0.023 |
| III | 1 | 0.089 | 0.023 |
|  | 2 | 0.048 | 0.035 |
|  | 3 | 0.072 | 0.011 |
|  | 4 | 0.066 | 0.029 |
|  | 5 | 0.074 | 0.041 |
|  | 6 | 0.090 | 0.045 |
|  | 7 | 0.050 | 0.028 |
|  | 8 | 0.085 | 0.036 |
|  | 9 | 0.044 | 0.061 |
|  | 10 | 0.027 | 0.009 |

Referring to Table 3, all the GaP diodes were prepared by forming an n-type liquid-phase epitaxial layer on an n-type substrate and further forming a p-type region adjacent to said first n-type layer by the process of liquid-phase epitaxy or diffusion. Lot I of Table 3 represents GaP diodes containing an n-type epitaxial layer prepared under the conditions of epitaxial growth shown in Table 2 associated with the case B. Lot II denotes GaP diodes containing an n-type epitaxial layer formed under the conditions of epitaxial growth set forth in Table 2 associated with the case A. Lot III shows the GaP diodes containing an n-type epitaxial layer obtained by the conventional process of adding nitrogen to an epitaxial growth solution at a temperature of 1050°C and cooling said solution from said temperature. Group a represents GaP diodes containing a p-type region formed by the process of liquid-phase epitaxy and Group b denotes GaP diodes containing a p-type region obtained by the process of diffusion.

As apparent from Table 3 above, the GaP diodes of Lot I present extremely minute variations in external quantum efficiency for both groups a and b. In Lot I, nitrogen atoms acting as luminescent centers are highly concentrated only in a ligh-emitting region, and the light emitted by the nitrogen atoms concentrated on the surface of the n-type epitaxial layer is little likely to be absorbed, as previously described, by nitrogen atoms themselves sparsely scattered in any other region than the luminescent surface of the n-type epitaxial layer, thereby attaining a high external quantum efficiency. In contrast, the GaP diodes of Lot II display a low external quantum efficiency for both groups a and b, though they present relatively small variations in external quantum efficiency. In Lot III, the GaP diodes indicate widely different variations in external quantum efficiency for both groups a and b and in consequence a low average value of said efficiency.

This invention is also applicable to the modified process where a p-type liquid-phase epitaxial layer of GaP is first grown on a p-type substrate of GaP and later an n-type epitaxial layer of GaP is formed adjacent to said p-type epitaxial layer. This modified process has been experimentally proved to be similarly effective. According to said modified process, a nitrogen-containing p-type liquid-phase epitaxial layer is first grown on a p-type substrate and then an n-type liquid-phase epitaxial layer is superposed on said p-type epitaxial layer, producing a diode. Even this modification reduces variations in the external quantum efficiency of respective GaP diodes to a level of ±5%, thus attaining a high degree of luminescence. Further, this invention is applicable not only to the above-mentioned light-emitting GaP diode having a single p-n junction, but also to a device having p-n-p-n structure with negative resistance.

The foregoing description refers to the case where nitrogen was added to an epitaxial growth solution from ammonia gas. However, addition of nitrogen from gallium nitride (GaN) was also confirmed to have the same effect. In the case of gallium nitride, epitaxial growth was effected by adding 2 mg of gallium nitride to 20g of gallium.

Other nitrogen compounds than ammonia and GaN such as PN, $P_2N_3$ and $P_3N_5$ can offer substantially the same degree of luninescence because the components constituting said other compounds are well incorporated in an epitaxial GaP layer without detriment to luminescent property.

What we claim is:

1. A method of manufacturing a green light-emitting gallium phosphide device which comprises the steps of adding nitrogen from a nitrogen compound to a liquid-phase epitaxial solution maintained at a higher temperature than 1030°C; precooling said solution to a temperature of 600° to 1000°C; bringing said precooled solution into contact with a substrate of gallium phosphide having the same conductivity type as said solution; cooling said solution for the formation of a nitrogen-containing liquid-phase epitaxial layer on said substrate; and forming a region in close proximity to said epitaxial layer with the opposite conductivity type thereto.

2. A method according to claim 1 wherein the nitrogen compound is one selected from the group consisting of ammonia, GaN, PN, $P_2N_3$ and $P_3N_5$.

3. A method according to claim 1 wherein nitrogen is added to the epitaxial solution maintained at a temperature of 1030° to 1100°C.

4. A method according to claim 1 wherein said epitaxial solution is brought into contact with the substrate at a temperature of 900° to 1000°C.

5. A method according to claim 1 wherein a layer having the opposite conductivity type to the epitaxial layer already formed on the substrate is superposed on the latter layer by the process of liquid-phase epitaxy.

6. A method according to claim 1 wherein a layer having the opposite conductivity type to the epitaxial layer already grown on the substrate is formed in the latter layer by the process of diffusion.

7. A method of manufacturing a green light-emitting gallium phosphide device which comprises the steps of adding nitrogen from a nitrogen compound to an n-type liquid-phase epitaxial solution maintained at a temperature of 1030° to 1100°C; precooling said solution to a temperature of 900° to 1000°C; bringing said precooled solution into contact with an n-type substrate of gallium phosphide; cooling said solution for the formation of a nitrogen-containing n-type liquid phase epitaxial layer on the substrate; and superposing a p-type liquid-phase epitaxial layer on said n-type epitaxial layer.

* * * * *